(12) United States Patent
Lindstedt

(10) Patent No.: US 6,950,358 B2
(45) Date of Patent: Sep. 27, 2005

(54) CIRCUIT ARRANGEMENT FOR SETTING A VOLTAGE SUPPLY FOR A TEST MODE OF AN INTEGRATED MEMORY

(75) Inventor: Reidar Lindstedt, München (DE)

(73) Assignee: Infineon Technologies, AG (DE)

( * ) Notice: Subject to any disclaimer, the term of this patent is extended or adjusted under 35 U.S.C. 154(b) by 0 days.

(21) Appl. No.: 10/947,449

(22) Filed: Sep. 23, 2004

(65) Prior Publication Data

US 2005/0068817 A1 Mar. 31, 2005

(30) Foreign Application Priority Data

Sep. 30, 2003 (DE) .......................................... 103 45 469

(51) Int. Cl.[7] .............................................. G11C 29/00
(52) U.S. Cl. .............. 365/201; 365/185.25; 365/185.23
(58) Field of Search .......................... 365/201, 185.25, 365/185.23, 189.09, 226, 230.06

(56) References Cited

U.S. PATENT DOCUMENTS 6,049,495 A    4/2000  Hsu et al.
6,549,480 B2 *  4/2003  Hosogane et al. .......... 365/226
6,714,065 B2 *  3/2004  Komiya et al. ............. 327/537

* cited by examiner

*Primary Examiner*—Anh Phung
*Assistant Examiner*—Dang T Nguyen
(74) *Attorney, Agent, or Firm*—Edell, Shapiro & Finnan

(57) ABSTRACT

A circuit arrangement for setting a voltage supply for a test mode of an integrated memory contains a voltage generator circuit for generating a supply voltage to apply to bit lines of the memory. A control circuit is driven by a test mode signal for identifying a test mode and is connected to the voltage generator circuit. The control circuit enables the supply voltage to be applied to at least one of the bit lines in the test mode. The voltage generator circuit generates a negative supply voltage value in the test mode in order to carry out a burn-in test mode with a sufficiently high voltage difference between word line and bit line even in the case of small feature dimensions and at the same time to comply with voltage limits with regard to a snapback breakdown.

12 Claims, 1 Drawing Sheet

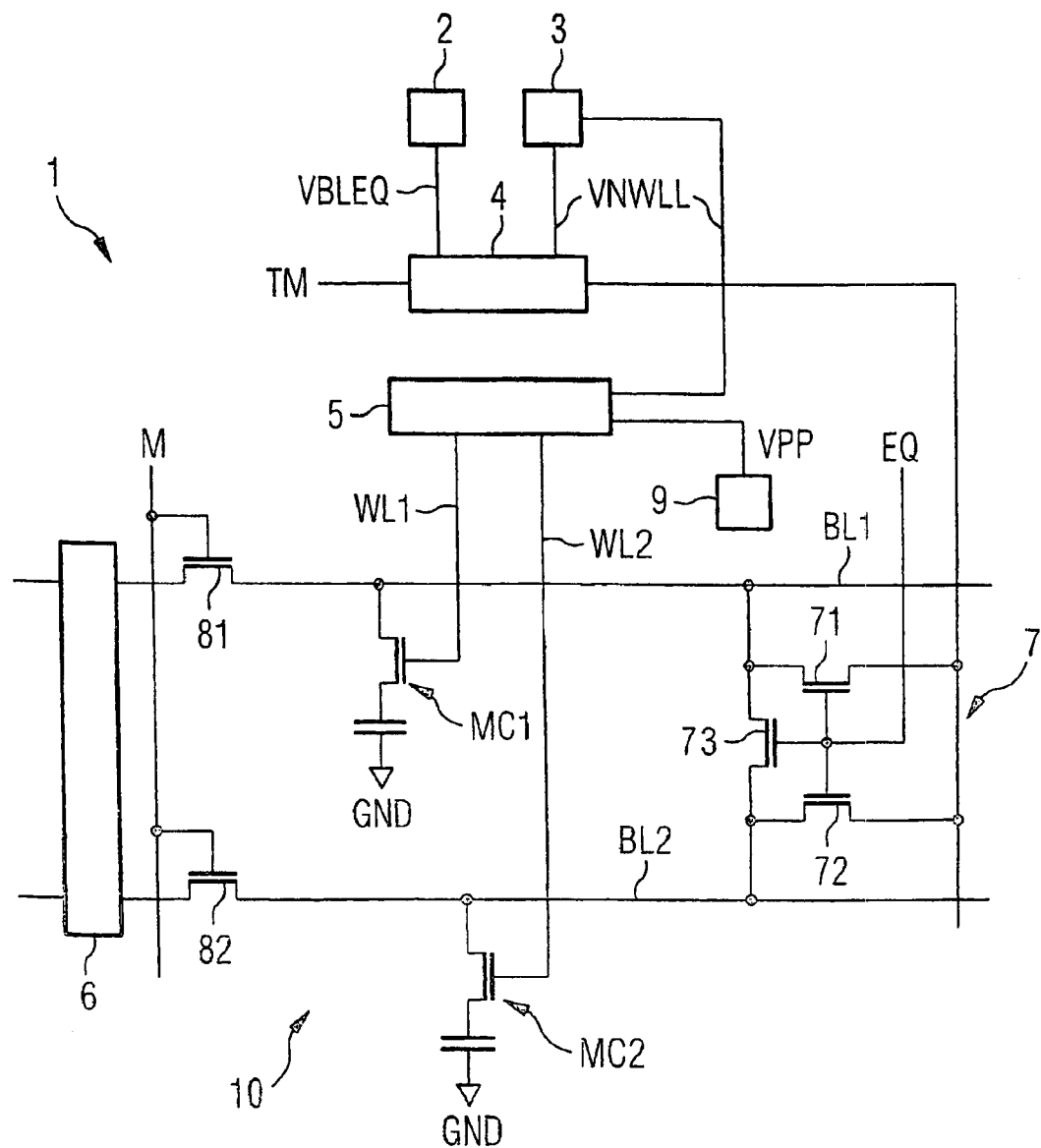

CIRCUIT ARRANGEMENT FOR SETTING A VOLTAGE SUPPLY FOR A TEST MODE OF AN INTEGRATED MEMORY

CROSS REFERENCE TO RELATED APPLICATIONS

This application claims priority under 35 USC §119 to German Application No. DE 10345469.1, filed on Sep. 30, 2003, and titled "Circuit Arrangement for Setting a Voltage Supply for a Test Mode of an Integrated Memory," the entire contents of which are hereby incorporated by reference.

FIELD OF THE INVENTION

The present invention relates to a circuit arrangement for setting a voltage supply for a test mode of an integrated memory.

BACKGROUND

In order to minimize the failure rate of integrated chips after the fabrication thereof, a burn-in test (also called stress test) is carried out in order to effect an artificial, accelerated ageing. Such a burn-in may either be carried out at the wafer level, when the individual integrated circuits have not yet been singulated and are present such that they are combined in the wafer, or, after singulation, may be applied to the chips that have already been separated and possibly already housed as well. Such burn-ins of one or the other type mentioned are also carried out in the case of DRAM memory chips in order to sort out those integrated chips which might already fail after a short operating time, so that the user as much as possible only acquires chips that attain a defined service life.

In order to artificially age an integrated chip, a relatively high voltage, in particular, is applied to it in the burn-in test. The voltage causes the chip to artificially age relatively rapidly, so that the ageing process is accelerated in a relatively short elapsed test time. In addition or as an alternative, a chip is exposed to an elevated ambient temperature so that an acceleration of the ageing process is likewise achieved. A burn-in test that aims to accelerate an ageing process stresses the semiconductor memory circuit to be tested, for example, with a greatest possible voltage difference between a word line and a bit line of the integrated memory. For this purpose, for example, a comparatively large word line voltage and a lowest possible bit line voltage are simultaneously applied.

The present technological trend is leading toward ever smaller feature dimensions. As a consequence, the dimensions of transistors are becoming ever smaller. However, smaller transistors are more susceptible to breakdowns and parasitic effects, principally the snapback breakdown. In a snapback breakdown, the space charge zones of the active areas of source and drain of a field-effect transistor touch one another above a specific voltage limit and the transistor channel breaks down with high current. The transistor channel is then damaged irreparably. This problem can be prevented only by limiting the applied supply voltages in operation and thus also in a test method, in order not to exceed the permissible voltage limit. It must be taken into account in this case that the permissible voltage limits decrease more than proportionally as feature dimensions decrease.

However, the quality requirements of an integrated chip remain the same or higher. This leads to conflicts, principally with regard to the abovementioned burn-in tests that are intended to sort out those chips which already do not satisfy the quality requirements after a short operating time. The application of relatively high voltages that are intended to cause the chip to artificially age relatively rapidly leads to conflicts with a permissible voltage limit due to relatively small feature dimensions of transistors connected to such an increased voltage. With regard to an integrated memory chip, for example, the ratio of a test voltage of a word line in the burn-in test mode to a nominal word line voltage given a feature size of 110 nm, for example, lies in the range of 1.5 to 1.6. Given a feature size of 90 nm, by contrast, the voltage ratio is significantly reduced by comparison due to reduced permissible voltage limits at the transistors reduced in size. This means that, in the case of a burn-in test mode, the maximum word line voltage is relatively smaller than in the case of earlier technologies as a result of the voltage limit with the snapback breakdown effect taken into account. In the burn-in test mode, such a reduced maximum test voltage affects the ageing effect more than proportionally since the magnitude of a test voltage in the burn-in test mode has to be taken into account exponentially with regard to the ageing process to be achieved.

A circuit arrangement for setting a voltage supply for a test mode of an integrated memory which contributes to reliably satisfying the quality requirements made of the integrated memory is desirable. A circuit arrangement that can be applied to burn-in tests at the wafer level, i.e., when the integrated components have not yet been singulated, is desirable.

The circuit arrangement according to the invention contains a voltage generator circuit for generating a supply voltage for application to bit lines of the integrated memory, and also a control circuit connected to the voltage generator circuit. The control circuit is driven by a test mode signal for identifying a test mode of the integrated memory. The control circuit enables the supply voltage to be applied to at least one of the bit lines in the test mode. The voltage generator circuit generates a negative supply voltage value in the test mode. As a result, a negative voltage is applied to the bit lines in the test mode. Furthermore, word lines are connected to a positive supply voltage in the test mode of the integrated memory.

A negative bit line voltage makes it possible to drastically increase the voltage difference between a positively charged word line and a negatively charged bit line, particularly when employing a burn-in test mode for accelerating an ageing process of the integrated memory. The negative supply voltage value is −0.5 V, for example. Compared with earlier test methods in which the bit lines are connected to the reference voltage of the memory, it is thus possible to increase the voltage difference by 0.5 V. With regard to the acceleration of an ageing process of the integrated memory, the result after conversion is acceleration factors that are increased by 30-fold by comparison. The invention thus makes it possible to carry out a burn-in test mode with a sufficiently high voltage difference between a word line and a bit line even given comparatively small feature dimensions and thus smaller dimensions of transistors, without the production of, in particular, a snapback breakdown. It is thus possible to satisfy the quality requirements for a memory and comply with the voltage limits with regard to a snapback breakdown. Principally transistors in the periphery of a memory cell array are not affected by the increased voltage difference between word line and bit line, so that the snapback breakdown can be prevented there while complying with a lower nominal word line voltage. In practice, the snapback breakdown generally does not occur in the memory cell array.

A voltage generator that provides a negative voltage for turning off cell array transistors in the closed state is used as voltage generator circuit for providing the negative supply voltage. Such a voltage generator can be connected to word lines of the integrated memory in order to apply a negative voltage to selected word lines from the word lines in a normal mode of the memory outside the test mode, in order to improve the blocking effect of selection transistors in the memory cell array. This makes it possible to use, as voltage generator circuit according to the invention, a voltage generator circuit that is already present in recent memory chips and, in the test mode, acquires a new function according to the invention.

In order to apply the negative supply voltage to at least one of the bit lines in the test mode, the control circuit is connected to a precharge voltage network for precharging the bit lines of the memory. For example, the control circuit is furthermore connected to a precharge voltage generator for generating a precharge voltage for the bit lines of the memory. In this case, the control circuit enables the voltage generator circuit or the precharge voltage generator to be connected to one of the bit lines via the precharge voltage network in switchable fashion.

A method for setting a voltage supply for a test mode of an integrated memory is described below. The method provides the generation of a negative supply voltage and a positive supply voltage. A control circuit of the integrated memory is driven by a test mode signal for activating a test mode of the integrated memory. Afterward, bit lines of the integrated memory are driven with the negative supply voltage in the test mode, whereas word lines are driven with the positive supply voltage in the test mode.

BRIEF DESCRIPTION OF THE FIGURE

The invention is explained in more detail below with reference to the FIGURE illustrated in the drawing.

DETAILED DESCRIPTION

The FIGURE shows an embodiment of a circuit arrangement according to the invention for setting a voltage supply for a burn-in test mode of an integrated memory. An exemplary memory cell array 10 of an integrated memory 1 is shown. The array has a plurality of word lines WL1, WL2 and bit lines BL1, BL2. The FIGURE shows an exemplary number of word lines and bit lines that are arranged within part of the memory cell array 10. In reality, a memory in the form of a DRAM, for instance, has a plurality of word lines and bit lines that are arranged between two sense amplifier strips in a partial region of the memory cell array that is delimited thereby. Furthermore, such a memory has a plurality of such demarcated partial regions and usually a number of identically constructed memory banks with respective memory cell arrays.

A number of memory cells arranged in matrix form along the word lines and bit lines are situated in the memory cell array 10 in accordance with the FIGURE. The memory cells MC1, MC2 shown are arranged at crossover points of the word lines and bit lines and in each case comprise a storage capacitor and a selection transistor connected up in the customary manner. A first terminal of a storage capacitor is connected to one of the bit lines via the controlled path of the corresponding selection transistor, and a second terminal of the storage capacitor is connected to the reference potential GND. For a selection of one of the memory cells, the respective selection transistor is turned on by an activated word line, as a result of which an evaluation and amplification of the data signal of the selected memory cells along said word line may subsequently be effected by a sense amplifier, illustrated based on the sense amplifier 6 in the FIGURE. In the embodiment in accordance with the FIGURE, the bit lines BL1, BL2 are organized in bit line pairs, it being possible for the bit lines to be connected to the common sense amplifier 6. A row decoder 5 is provided for selection of the word lines WL1, WL2. The bit lines BL1, BL2 are connected to the sense amplifier 6 via an isolation switch 81 and 82 respectively, which are driven by a multiplex control signal M.

The memory in accordance with the FIGURE furthermore has a precharge circuit with a precharge voltage network 7, which can be connected to the bit lines BL1, BL2. The precharge circuit with precharge voltage network serves for precharging the bit lines BL1, BL2 to a precharge voltage VBLEQ made available by a precharge voltage generator 2. The precharge circuit has the precharge transistor 71 and 72, the controlled paths of which are connected to a terminal of the precharge voltage network 7 for the precharge voltage VBLEQ and to one of the bit lines BL1, BL2. A transistor 73, i.e., equalized transistor, is provided by which the bit lines BL1, BL2 can be connected to one another, i.e., "equalizing". The precharge transistors 71, 72 and the equalized transistor 73 are driven by the control signal EQ.

Furthermore, a control circuit 4 is provided, which is connected to a voltage generator circuit 3 and to the precharge voltage generator 2 already mentioned. A negative supply voltage VNWLL is generated by the voltage generator circuit 3. In the normal mode of the memory, the negative supply voltage VNWLL serves for improving the blocking effect of the selection transistors of the memory cells. For this purpose, the voltage generator circuit 3 is connected to the word lines WL1, WL2 via the row decoder 5 in order to apply the negative voltage VNWLL to selected word lines from said word lines in the normal mode of the memory.

The control circuit 4 is driven by a test mode signal TM for identifying a test mode of the integrated memory, in particular a burn-in test mode. The control circuit, under the control of the test mode signal TM, enables the voltage generator circuit 3 or the precharge voltage generator 2 to be connected to the bit lines BL1, BL2 via the precharge voltage network 7 in switchable fashion. In the normal case, the precharge voltage generator 2 for providing the precharge voltage VBLEQ, which lies between the reference voltage and the maximum positive bit line voltage, is connected to the precharge voltage network 7. In the burn-in test mode, by contrast, the voltage generator circuit 3 for generating the negative supply voltage VNWLL is connected to the precharge voltage network 7 via the control circuit 4 in order to bring the bit lines BL1, BL2 to a negative supply voltage value. In the burn-in test mode, the word lines WL1, WL2 are connected to the voltage source 9 for generating a positive supply voltage VPP.

If the negative supply voltage VNWLL is present at the precharge network 7, the precharge transistors 71 and 72 and also the equalize transistor 73 are opened, so that the voltage VNWLL is present on the bit lines BL1, BL2. It is thus possible to increase the voltage difference between the word lines WL1, WL2 and the bit lines BL1, BL2 in the burn-in test mode without, for example, transistors in the row decoder 5 being influenced thereby. This makes it possible to choose the voltage VPP such that a predetermined voltage limit on account of reduced feature sizes is not exceeded. The quality of a burn-in test is not adversely influenced in this case, however.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Integrated memory
2 Precharge voltage generator
3 Voltage generator circuit
4 Control circuit
5 Row decoder
6 Sense amplifier
7 Precharge voltage network
9 Voltage source
10 Memory cell array
81, 82 Isolation switches
71, 72 Precharge transistors
73 Equalize transistor
M Control signal
EQ Control signal
TM Test mode signal
VBLEQ Precharge voltage
VNWLL Negative supply voltage
VPP Positive supply voltage
BL1, BL2 Bit line
WL1, WL2 Word line
MC1, MC2 Memory cell
GND Reference potential

I claim:

1. A circuit arrangement for setting a voltage supply for a test mode of an integrated memory, comprising:
   a plurality of word lines, the word lines being connected to a positive supply voltage in the test mode of the integrated memory;
   a voltage generator circuit for generating a supply voltage for application to bit lines of the integrated memory; and
   a control circuit, the control circuit being driven by a test mode signal for identifying a test mode of the integrated memory, the control circuit being connected to the voltage generator circuit, the control circuit enabling the supply voltage to be applied to at least one of the bit lines in the test mode,
   wherein the voltage generator circuit generates a negative supply voltage value in the test mode.

2. The circuit arrangement as claimed in claim 1, wherein the voltage generator circuit is connected to word lines of the integrated memory, the voltage generator circuit applying a negative voltage to selected word lines from said word lines outside the test mode.

3. The circuit arrangement as claimed in claim 1, wherein the test mode signal identifies a burn-in test mode, and the voltage generator circuit generates a negative supply voltage value in the burn-in test mode.

4. The circuit arrangement as claimed in claim 1, wherein the word lines of the memory are connected to a voltage source with a positive supply voltage in the test mode.

5. The circuit arrangement as claimed in claim 1, wherein the control circuit is connected to a precharge voltage network for precharging the bit lines of the memory.

6. The circuit arrangement as claimed in claim 1, further comprising a precharge voltage generator for generating a precharge voltage for the bit lines of the memory, the precharge voltage generator being connected to the control circuit,
   wherein the control circuit enables the voltage generator circuit or the precharge voltage generator to be connected to one of the bit lines in switchable fashion.

7. The circuit arrangement as claimed in claim 1, further comprising:
   a row decoder for selection of the word lines is provided,
   wherein the word lines are connected to the voltage generator circuit for generating the negative supply voltage value via the row decoder in the test mode.

8. The circuit arrangement as claimed in claim 5, wherein the precharge voltage network includes switching transistors, and
   the bit lines are connected to the control circuit via the switching transistors of the precharge voltage network in the test mode.

9. A method for setting a voltage supply for a test mode of an integrated memory, comprising:
   generating of a negative supply voltage and a positive supply voltage;
   driving a control circuit with a test mode signal for activation of a test mode of the integrated memory;
   driving the bit lines with the negative supply voltage in the test mode; and
   driving the word lines with the positive supply voltage in the test mode.

10. The method for setting a voltage supply for a test mode of an integrated memory as claimed in claim 9, further comprising:
    driving the word lines that are connected to memory cells with the negative supply voltage between two accesses to the memory cells; and
    isolating of the word lines from the negative supply voltage in the test mode.

11. The circuit arrangement as claimed in claim 6, wherein the control circuit is connected to a precharge voltage network, and the precharge voltage network includes switching transistors, and
    the bit lines are connected to the control circuit via the switching transistors of the precharge voltage network in the test mode.

12. The circuit arrangement as claimed in claim 7, wherein the control circuit is connected to a precharge voltage network, and the precharge voltage network includes switching transistors, and
    the bit lines are connected to the control circuit via the switching transistors of the precharge voltage network in the test mode.

* * * * *